United States Patent
Lim

(10) Patent No.: US 12,367,918 B2
(45) Date of Patent: Jul. 22, 2025

(54) SEMICONDUCTOR DEVICE AND SEMICONDUCTOR SYSTEM RELATED TO ROW HAMMER REFRESH

(71) Applicant: SK hynix Inc., Icheon-si Gyeonggi-do (KR)

(72) Inventor: Jung Ho Lim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 147 days.

(21) Appl. No.: 18/449,540

(22) Filed: Aug. 14, 2023

(65) Prior Publication Data

US 2024/0379145 A1     Nov. 14, 2024

(30) Foreign Application Priority Data

May 9, 2023   (KR) .................. 10-2023-0060183

(51) Int. Cl.
  *G11C 7/00*       (2006.01)
  *G11C 11/406*     (2006.01)
(52) U.S. Cl.
  CPC .............................. *G11C 11/40615* (2013.01)
(58) Field of Classification Search
  CPC .............................................. G11C 11/40615
  See application file for complete search history.

(56) References Cited

U.S. PATENT DOCUMENTS 10,229,728 B2    3/2019  Morgan et al.
2022/0084564 A1* 3/2022  Choi ................... G11C 29/783

FOREIGN PATENT DOCUMENTS

KR    1020180114712 A    10/2018

* cited by examiner

*Primary Examiner* — Hoai V Ho
(74) *Attorney, Agent, or Firm* — WILLIAM PARK & ASSOCIATES LTD.

(57) ABSTRACT

A semiconductor device includes an interval control circuit configured to generate a detection interval signal by detecting that an internal address, which is input right before a pulse of a row hammer command signal is generated, is sampled as a target address, a signal correction circuit configured to generate a correction random signal adjust the internal address so that the internal address is sampled as the target address less than or equal to a preset number of times between consecutive pulses of the row hammer command signal during a designation interval and a detection interval in which the detection interval signal is activated, and a row hammer refresh circuit configured to execute a row hammer refresh based on the target address that is generated in response to the correction random signal.

20 Claims, 13 Drawing Sheets

SEMICONDUCTOR DEVICE AND SEMICONDUCTOR SYSTEM RELATED TO ROW HAMMER REFRESH

CROSS-REFERENCE TO RELATED APPLICATION

The present application claims priority under 35 U.S.C. § 119 (a) to Korean Patent Application No. 10-2023-0060183, filed in the Korean Intellectual Property Office on May 9, 2023, the entire disclosure of which is incorporated herein by reference.

BACKGROUND

The present disclosure relates to a semiconductor device and semiconductor system related to row hammer refresh.

Among semiconductor devices, DRAM has a phenomenon in which information stored in a memory cell is lost over time unlike static random access memory (SRAM) or flash memory. In order to prevent such a phenomenon, an operation of writing information stored in a memory cell again at certain periods on the outside is performed. A series of such operations is called refresh. Refresh is executed in a way to sense and amplify data by activating a word line at least once within a retention time of each memory cell within a bank. In this case, the retention time refers to the time during which data can be maintained in a memory cell without refreshing after the data is written in the memory cell.

As the degree of integration of memory cells included in a semiconductor device increases, the influence of interference between the memory cells gradually increases. As an access operation for one memory cell is repeated, row hammer in which information stored in adjacent memory cells is lost is caused. Accordingly, the loss of information attributable to row hammer is prevented by row hammer refresh that is performed on adjacent memory cells in addition to a target address when refresh is executed.

SUMMARY

In an embodiment, a semiconductor device may include an interval control circuit configured to generate a detection interval signal by detecting that an internal address, which is input right before a pulse of a row hammer command signal is generated, is sampled as a target address, a signal correction circuit configured to generate a correction random signal to adjust the internal address so that the internal address is sampled as the target address less than or equal to a preset number of times between consecutive pulses of the row hammer command signal during a designation interval and a detection interval in which the detection interval signal is activated, and a row hammer refresh circuit configured to execute a row hammer refresh based on the target address that is generated in response to the correction random signal.

In an embodiment, a semiconductor device may include a command random signal generation circuit configured to generate a pulse of a command random signal, when a random signal is in a state in which the random signal has been activated for a sampling operation, in synchronization with a timing at which a pulse of a row hammer command signal is generated, a correction random signal generation circuit configured to generate a correction random signal by adjusting an interval in which the random signal is activated between consecutive pulses of the row hammer command signal during a designation interval and a detection interval, in response to a detection interval signal that is activated during the detection interval from a timing at which the pulse of the command random signal is generated and a designation interval signal that is activated for each designation interval, and a row hammer refresh circuit configured to execute a row hammer refresh based on a target address that is generated in response to the correction random signal.

In an embodiment, a semiconductor system may include a controller configured to apply a command and an address, and a semiconductor device configured to set a detection interval by detecting that an internal address generated from the address, which is input right before a pulse of a row hammer command signal for a row hammer refresh is generated, is sampled as a target address based on the command, configured to adjust the number of times that the internal address is sampled as the target address between consecutive pulses of the row hammer command signal during the detection interval, and configured to execute the row hammer refresh based on the target address.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level."

Hereafter, the present disclosure will be described in more detail through embodiments. The embodiments are only used to exemplify the present disclosure, and the scope of the present disclosure is not limited by the embodiments.

Embodiments of the present disclosure provide a semiconductor device and semiconductor system related to a row hammer refresh.

Figure 1:
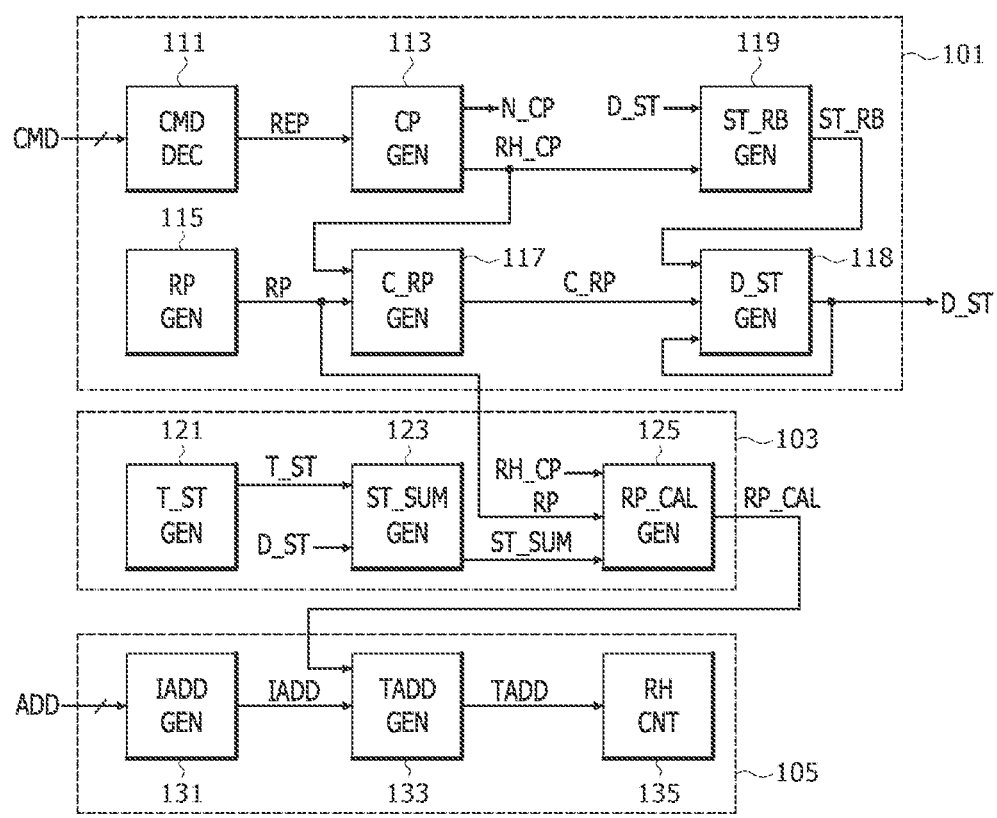
FIG. 1 is a block diagram illustrating a construction of a semiconductor device according to an example of the present disclosure.

FIG. 1 is a block diagram illustrating a construction of a semiconductor device 10 according to an example of the present disclosure.

As illustrated in FIG. 1, the semiconductor device 10 may include an interval control circuit 101, a signal correction circuit 103, and a row hammer refresh circuit 105. The interval control circuit 101 may generate a detection interval signal D_ST by detecting that an internal address IADD, which is input right before a pulse of a row hammer command signal RH_CP is generated, is sampled as a target address TADD for a row hammer refresh when the target address TADD is generated. The row hammer command signal RH_CP may be generated for the row hammer refresh. The detection interval signal D_ST may be activated during a detection interval. The signal correction circuit 103 may generate a correction random signal RP_CAL to adjust the internal address IADD so that the internal address IADD is sampled as the target address TADD less than or equal to a preset number of times between consecutive pulses of the row hammer command signals RH_CP during a designation interval and the detection interval. The row hammer refresh circuit 105 may sample the internal address IADD as the target address TADD in response to the correction random signal RP_CAL and may execute the row hammer refresh on memory cells adjacent to a memory cell that is accessed by the target address TADD.

The interval control circuit 101 may include a command decoder (CMD DEC) 111, a command signal generation circuit (CP GEN) 113, a random signal generation circuit (RP GEN) 115, a command random signal generation circuit (C_RP GEN) 117, a detection interval signal generation circuit (D_ST GEN) 118, and an interval reset signal generation circuit (ST_RB GEN) 119.

Figure 11:
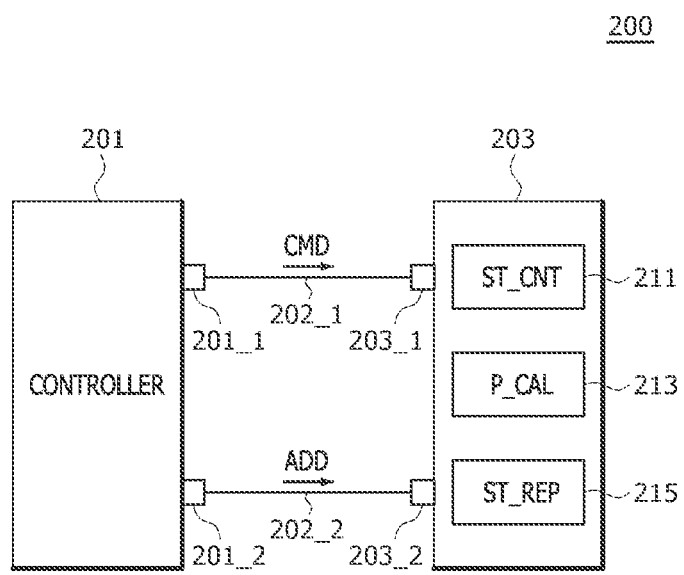
FIG. 11 is a block diagram illustrating a construction of a semiconductor system according to an example of the present disclosure.

The command decoder 111 may receive a command CMD from a controller (201 in FIG. 11). The command decoder 111 may generate a refresh signal REP for a refresh by decoding the command CMD. The command CMD may include multiple bits. The command decoder 111 may generate the refresh signal REP when receiving the command CMD including bits having a preset logic bit set.

The command signal generation circuit 113 may receive the refresh signal REP from the command decoder 111. The command signal generation circuit 113 may generate the normal command signal N_CP and the row hammer command signal RH_CP in response to the refresh signal REP. The normal command signal N_CP may be generated for a normal refresh. The row hammer command signal RH_CP may be generated for row hammer refresh. The normal refresh may be defined as a refresh that is performed on a memory cell (not illustrated) that is accessed by the target address TADD. The row hammer refresh may be defined as a refresh that is performed on memory cells adjacent to a memory cell (not illustrated) that is accessed by the target address TADD. When a pulse of the refresh signal REP is generated N times, the command signal generation circuit 113 may generate a pulse of the row hammer command signal RH_CP once after generating a pulse of the normal command signal N_CP (N−1) times. When the refresh is performed N times, the command signal generation circuit 113 may generate a pulse of the row hammer command signal RH_CP once after generating a pulse of the normal command signal N_CP (N−1) times to execute the row hammer refresh once after performing the normal refresh (N−1) times.

The random signal generation circuit 115 may generate a random signal RP having a random pattern. For example, the random signal generation circuit 115 may generate the random signal RP that has been set as a pseudo random bit sequence (PBRS). The pseudo random bit sequence may mean a bit string having a pseudo-randomly generated pattern.

The command random signal generation circuit 117 may receive the row hammer command signal RH_CP from the command signal generation circuit 113. The command random signal generation circuit 117 may receive the random signal RP. The command random signal generation circuit 117 may generate a command random signal C_RP in response to the row hammer command signal RH_CP and the random signal RP. When the random signal RP is in the state in which the random signal RP has been activated to a logic level for a sampling operation, the command random signal generation circuit 117 may generate a pulse of the command random signal C_RP in synchronization with a timing at which a pulse of the row hammer command signal RH_CP is generated for the row hammer refresh. For example, the command random signal generation circuit 117 may generate a pulse of the command random signal C_RP when the random signal RP is activated to a logic high level in synchronization with the timing at which a pulse of the row hammer command signal RH_CP is generated.

The detection interval signal generation circuit 118 may receive the command random signal C_RP from the command random signal generation circuit 117 and may receive an interval reset signal ST_RB from the interval reset signal generation circuit 119. The detection interval signal generation circuit 118 may generate a detection interval signal D_ST in response to the command random signal C_RP and the interval reset signal ST_RB. The detection interval signal generation circuit 118 may generate the detection interval signal D_ST that is activated at a timing at which a pulse of the command random signal C_RP is generated and may generate the detection interval signal D_ST that is deactivated at a timing at which a pulse of the interval reset signal ST_RB is generated. The detection interval signal generation circuit 118 may generate the detection interval signal D_ST that is activated during an interval from the timing at which a pulse of the command random signal C_RP is generated to the timing at which a pulse of the interval reset signal ST_RB is generated.

The interval reset signal generation circuit 119 may receive the row hammer command signal RH_CP from the command signal generation circuit 113 and may receive the detection interval signal D_ST from the detection interval signal generation circuit 118. The interval reset signal generation circuit 119 may generate a pulse of the interval reset signal ST_RB in response to the row hammer command signal RH_CP and the detection interval signal D_ST. The interval reset signal generation circuit 119 may generate a pulse of the interval reset signal ST_RB by counting the number of pulses of the row hammer command signal RH_CP during an interval in which the detection interval signal D_ST is activated. The interval reset signal generation circuit 119 may generate a pulse of the interval reset signal ST_RB at a timing at which a reset interval (tdR in FIG. 4) elapses from a timing at which the detection interval signal D_ST is activated. For example, the interval reset signal generation circuit 119 may count the number of pulses of the row hammer command signal RH_CP from a timing at which the detection interval signal D_ST is activated when the reset interval (tdR in FIG. 4) is set as an interval in which the number of pulses of the row hammer command signal RH_CP is counted three times and may generate a pulse of the interval reset signal ST_RB when the number of pulses of the row hammer command signal RH_CP is counted three times. The detection interval signal D_ST may be activated during an interval from a timing at which a pulse of the command random signal C_RP is generated to the timing at which the reset interval (tdR in FIG. 4) elapses.

The signal correction circuit 103 may include a designation interval signal generation circuit (T_ST GEN) 121, a synthesis interval signal generation circuit (ST_SUM GEN) 123, and a correction random signal generation circuit (RP_CAL GEN) 125.

The designation interval signal generation circuit 121 may generate a designation interval signal T_ST that is activated for each designation interval. The designation interval signal generation circuit 121 may be implemented as an oscillator circuit (not illustrated) and may generate the designation interval signal T_ST that is set as a period signal and that is activated for each designation interval.

The synthesis interval signal generation circuit 123 may receive the detection interval signal D_ST from the detection interval signal generation circuit 118 and may receive the designation interval signal T_ST from the designation interval signal generation circuit 121. The synthesis interval signal generation circuit 123 may generate a synthesis interval signal ST_SUM in response to the detection interval signal D_ST and the designation interval signal T_ST. The synthesis interval signal generation circuit 123 may generate the synthesis interval signal ST_SUM that is activated during an interval in which the designation interval signal T_ST is activated. In addition, the synthesis interval signal generation circuit 123 may generate the synthesis interval signal ST_SUM that is activated during to an interval in which the detection interval signal D_ST is activated.

The correction random signal generation circuit 125 may receive the row hammer command signal RH_CP from the command signal generation circuit 113, receive the random signal RP from the random signal generation circuit 115, and receive the synthesis interval signal ST_SUM from the synthesis interval signal generation circuit 123. The correction random signal generation circuit 125 may generate the correction random signal RP_CAL in response to the row hammer command signal RH_CP, the random signal RP, and the synthesis interval signal ST_SUM. The correction random signal generation circuit 125 may generate the correction random signal RP_CAL by adjusting an interval in which the random signal RP is activated between consecutive pulses of the row hammer command signals RH_CP during an interval in which the synthesis interval signal ST_SUM is activated. For example, during the interval in which the synthesis interval signal ST_SUM is activated, the correction random signal generation circuit 125 may output the random signal RP as the correction random signal RP_CAL during an interval from a pulse of the row hammer command signal RH_CP to a timing at which a falling edge of the random signal RP is generated twice (shown in FIG. 8), the correction random signal RP_CAL being deactivated during an interval after the falling edge of the random signal RP is generated twice until a subsequent pulse of the row hammer command signals RH_CP is generated. That is, the correction random signal generation circuit 125 may output the random signal RP as the correction random signal RP_CAL only during an interval from a pulse of the row hammer command signal RH_CP to a timing at which the activation interval of the random signal RP is terminated twice. In this case, a condition that is set to generate the correction random signal RP_CAL, that is, a condition in which a falling edge of the random signal RP is generated twice is merely an embodiment, and the present disclosure is not limited thereto.

The row hammer refresh circuit 105 may include an internal address generation circuit (IADD GEN) 131, a target address generation circuit (TADD GEN) 133, and a row hammer control circuit (RH_CNT) 135.

The internal address generation circuit 131 may receive an address ADD from the controller (201 in FIG. 11). The internal address generation circuit 131 may generate the internal address IADD for accessing a memory cell that is refreshed from the address ADD. The internal address IADD may be a row address for selecting a word line (not illustrated), but the present disclosure is not limited thereto.

The target address generation circuit 133 may receive the correction random signal RP_CAL from the correction random signal generation circuit 125 and may receive the internal address IADD from the internal address generation circuit 131. The target address generation circuit 133 may generate the target address TADD from the internal address IADD in response to the correction random signal RP_CAL. The target address generation circuit 133 may output the internal address IADD as the target address TADD by sampling the internal address IADD when the correction random signal RP_CAL is activated. The target address generation circuit 133 may maintain the target address TADD without sampling the internal address IADD when the correction random signal RP_CAL is deactivated.

The row hammer control circuit 135 may receive the target address TADD from the target address generation circuit 133. When the target address TADD is generated by sampling the internal address IADD, the row hammer control circuit 135 may control the execution of the row hammer refresh on memory cells adjacent to a memory cell that is accessed by the target address TADD.

Figure 2:
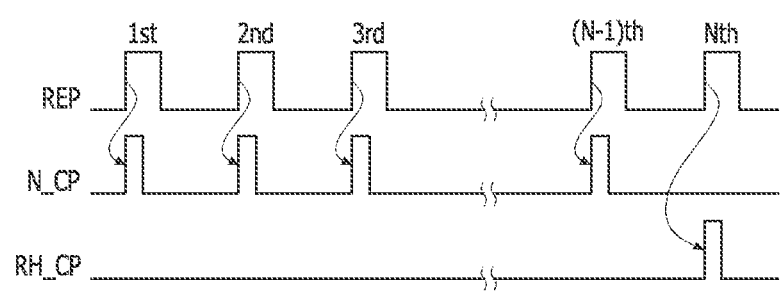
FIG. 2 is a timing diagram describing an operation of a command signal generation circuit that is included in the semiconductor device illustrated in FIG. 1.

FIG. 2 is a timing diagram describing an operation of the command signal generation circuit 113. As illustrated in FIG. 2, when a refresh is performed N times and a pulse of the refresh signal REP is generated N times, the command signal generation circuit 113 may generate a pulse of the normal command signal N_CP (N−1) times in order to perform a normal refresh (N−1) times and may then generate a pulse of the row hammer command signal RH_CP once in order to execute a row hammer refresh once.

Figure 3:
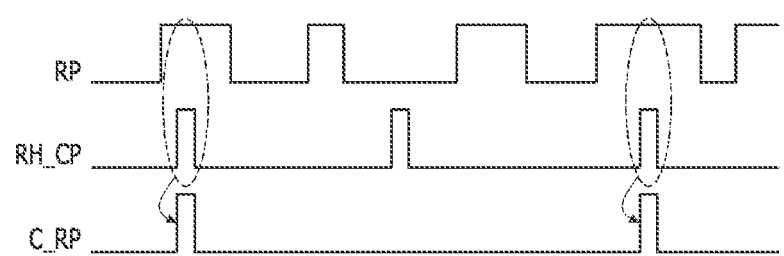
FIG. 3 is a timing diagram describing an operation of a command random signal generation circuit that is included in the semiconductor device illustrated in FIG. 1.

FIG. 3 is a timing diagram describing an operation of the command random signal generation circuit 117. As illustrated in FIG. 3, the command random signal generation circuit 117 may generate a pulse of the command random signal C_RP, when the random signal RP is activated to a logic high level, in synchronization with a timing at which a pulse of the row hammer command signal RH_CP is generated. The command random signal generation circuit 117 might not generate a pulse of the command random signal C_RP, when the random signal RP is deactivated to a logic low level, in synchronization with the timing at which a pulse of the row hammer command signal RH_CP is generated.

Figure 4:
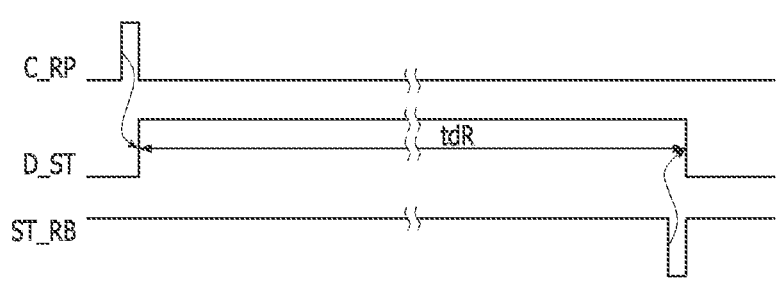
FIG. 4 is a timing diagram describing an operation of a detection interval signal generation circuit that is included in the semiconductor device illustrated in FIG. 1.

FIG. 4 is a timing diagram describing an operation of the detection interval signal generation circuit 118. As illustrated in FIG. 4, the detection interval signal generation circuit 118 may generate the detection interval signal D_ST that is activated to a logic high level during the reset interval tdR from a timing at which a pulse of the command random signal C_RP is generated to a timing at which a pulse of the interval reset signal ST_RB is generated.

Figure 5:
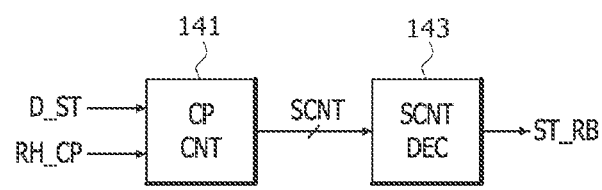
FIG. 5 is a block diagram illustrating a construction according to an example of an interval reset signal generation circuit that is included in the semiconductor device illustrated in FIG. 1.

FIG. 5 is a block diagram illustrating a construction of an interval reset signal generation circuit 119A according to an example of the interval reset signal generation circuit 119. As illustrated in FIG. 5, the interval reset signal generation circuit 119A may include a command signal counter (CP CNT) 141 and a count signal decoder (SCNT DEC) 143.

The command signal counter 141 may generate a count signal SCNT based on the detection interval signal D_ST and the row hammer command signal RH_CP. The command signal counter 141 may generate the count signal SCNT by counting the number of pulses of the row hammer command signal RH_CP during an interval in which the detection interval signal D_ST is activated. For example, the command signal counter 141 may generate the count signal SCNT including bits that have been set as a first logic bit set by counting the first pulse of the row hammer command signal RH_CP during an interval in which the detection interval signal D_ST is activated and may generate the count signal SCNT including bits that have been set as a second logic bit set by counting the second pulse of the row hammer command signal RH_CP.

The count signal decoder 143 may receive the count signal SCNT from the command signal counter 141. The count signal decoder 143 may generate the interval reset signal ST_RB by decoding the count signal SCNT. The count signal decoder 143 may generate a pulse of the interval reset signal ST_RB when receiving the count signal SCNT including bits that have been set as a preset logic bit set. For example, the count signal decoder 143 may generate a pulse of the interval reset signal ST_RB when receiving the count signal SCNT including bits that have been set as an M-th logic bit set by counting an M-th pulse of the row hammer command signal RH_CP during an interval in which the detection interval signal D_ST is activated. In this case, "M" may be set as a natural number equal to or greater than 2.

Figure 6:
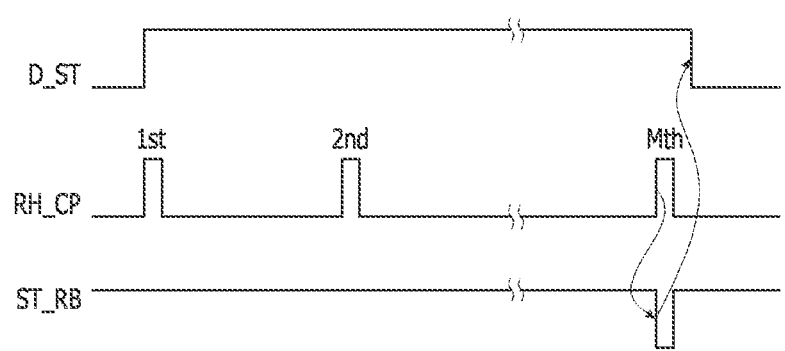
FIG. 6 is a timing diagram describing an operation of the interval reset signal generation circuit illustrated in FIG. 5.
Figure 7:
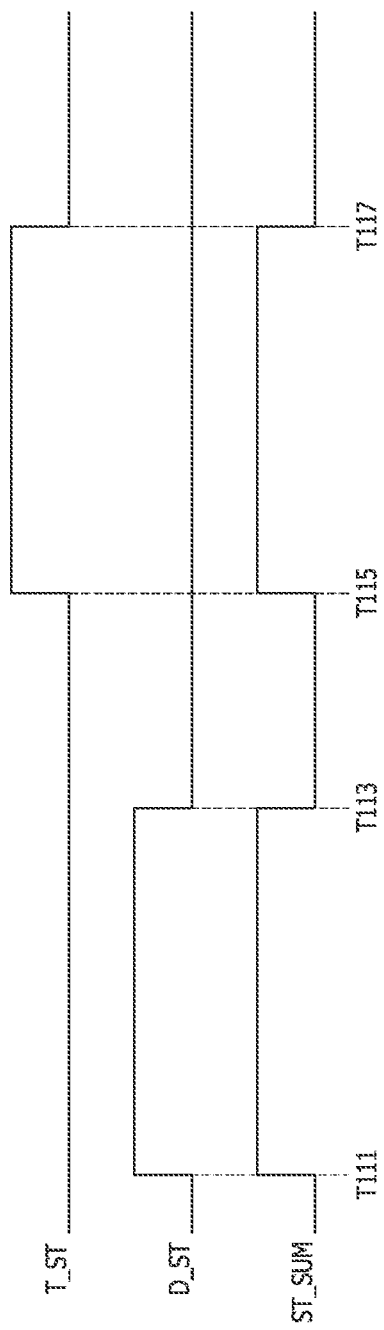
FIG. 7 is a timing diagram describing an operation of a synthesis interval signal generation circuit that is included in the semiconductor device illustrated in FIG. 1.

FIG. 6 is a timing diagram describing an operation of the interval reset signal generation circuit 119A. As illustrated in FIG. 6, the interval reset signal generation circuit 119A may generate a pulse of the interval reset signal ST_RB when counting an M-th pulse of the row hammer command signal RH_CP during an interval in which the detection interval signal D_ST is activated to a logic high level. FIG. 7 is a timing diagram describing an operation of the synthesis interval signal generation circuit 123. As illustrated in FIG. 7, the synthesis interval signal generation circuit 123 may generate the synthesis interval signal ST_SUM that is activated to a logic high level during an interval T111 to T113 and an interval T115 to T117 by receiving the detection interval signal D_ST that is activated to a logic high level during the interval T111 to T113 and the designation interval signal T_ST that is activated to a logic high level during the interval T115 to T117.

Figure 8:
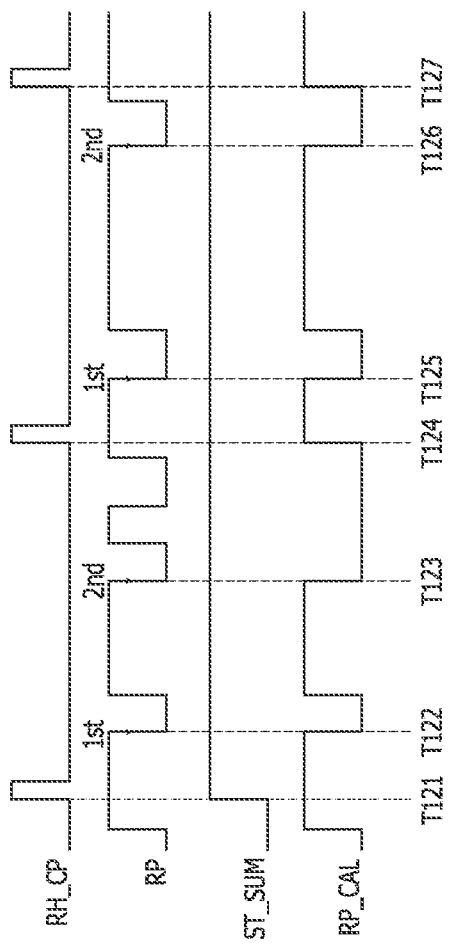
FIG. 8 is a timing diagram describing an operation of a correction random signal generation circuit that is included in the semiconductor device illustrated in FIG. 1.

FIG. 8 is a timing diagram describing an operation of the correction random signal generation circuit 125. As illustrated in FIG. 8, the correction random signal generation circuit 125 may generate the correction random signal RP_CAL by adjusting an interval in which the random signal RP is activated between consecutive pulses of the row hammer command signals RH_CP. More specifically, the correction random signal generation circuit 125 may generate the correction random signal RP_CAL. The number of activation intervals of the correction random signal RP_CAL is adjusted to be less than or equal to two between consecutive pulses of the row hammer command signal RH_CP, which is described in detail as follows.

First, between the first and second pulses of the row hammer command signal RH_CP, which is interval T121 to T124, the correction random signal generation circuit 125 may output the random signal RP as the correction random signal RP_CAL during an interval T121 to T123 until the second falling edge of the random signal RP is generated. Furthermore, between the first and second pulses of the row hammer command signal RH_CP, which is interval T121 to T124, the correction random signal generation circuit 125 may generate the correction random signal RP_CAL having a deactivated state during the interval T123 to T124 after the second falling edge of the random signal RP is generated.

Between the second and third pulses of the row hammer command signal RH_CP, which is interval T124 to T127, the correction random signal generation circuit 125 may output the random signal RP as the correction random signal RP_CAL during an interval T124 to T126 until the second falling edge of the random signal RP is generated. Furthermore, between the second and third pulses of the row hammer command signal RH_CP, which is interval T124 to T127, the correction random signal generation circuit 125 may generate the correction random signal RP_CAL having a deactivated state during the interval T126 to T127 after the second falling edge of the random signal RP is generated.

Figure 9:
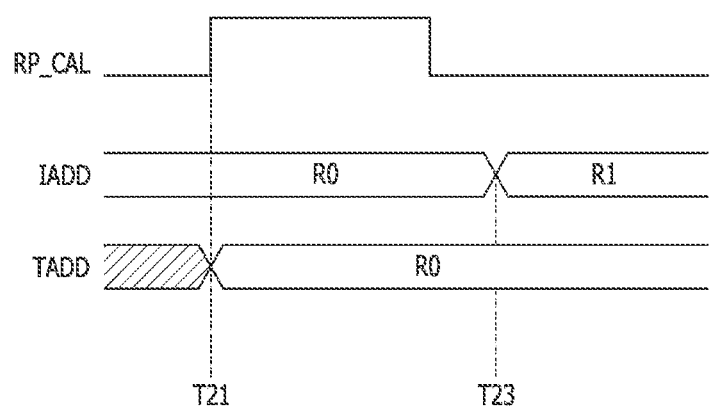
FIGS. 9 and 10 are timing diagrams describing an operation of a target address generation circuit that is included in the semiconductor device illustrated in FIG. 1.
Figure 10:
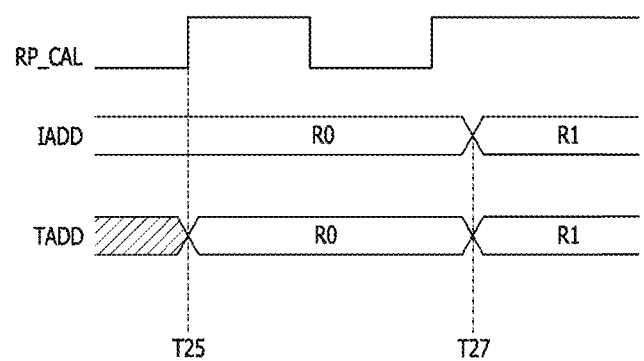

FIGS. 9 and 10 are timing diagrams describing an operation of the target address generation circuit 133.

As illustrated in FIG. 9, when the correction random signal RP_CAL is activated to a logic high level at timing T21, the target address generation circuit 133 may generate the target address TADD, the logic bit set of which has been set as R0 by sampling the internal address IADD, the logic bit set of which has been set as R0. In this case, R0 may mean a first logic bit set of bits that have been included in the address. At timing T23, the logic bit set of the internal address IADD may be changed from R0 to R1, but the target address TADD may maintain R0 because the correction random signal RP_CAL has been deactivated to a logic low level. In this case, R1 may mean a second logic bit set of bits that have been included in the address. The second logic bit set is set differently from the first logic bit set.

As illustrated in FIG. 10, when the correction random signal RP_CAL is activated to a logic high level at timing T25, the target address generation circuit 133 may generate the target address TADD, the logic bit set of which has been set as R0 by sampling the internal address IADD, the logic bit set of which has been set as R0. At timing T27, when the logic bit set of the internal address IADD is changed from R0 to R1, the logic bit set of the target address TADD may be changed from R0 to R1 because the correction random signal RP_CAL has been activated to a logic high level.

FIG. 11 is a block diagram illustrating a construction of a semiconductor system 200 according to an example of the present disclosure. As illustrated in FIG. 11, the semiconductor system 200 may include the controller 201 and a semiconductor device 203.

The controller 201 may include a first control pin 201_1 and a second control pin 201_2. The semiconductor device 203 may include a first device pin 203_1 and a second device pin 203_2. The controller 201 may transmit the command CMD to the semiconductor device 203 through a first transmission line 202_1 that is connected between the first control pin 201_1 and the first device pin 203_1. Each of the first control pin 201_1, the first transmission line 202_1, and the first device pin 203_1 may be implemented in multiple numbers depending on the number of bits that are included in the command CMD. The controller 201 may apply the address ADD to the semiconductor device 203 through a second transmission line 202_2 that is connected between the second control pin 201_2 and the second device pin 203_2. Each of the second control pin 201_2, the second device pin 203_2, and the second transmission line 202_2 may be implemented in multiple numbers depending on the number of bits that are included in the address ADD.

The semiconductor device 203 may include an interval control circuit (ST_CNT) 211, a signal correction circuit (P_CAL) 213, and a row hammer refresh circuit (ST_REP) 215. The interval control circuit 211 may be implemented identically with the interval control circuit 101, illustrated in FIG. 1, and may generate the detection interval signal D_ST by detecting that the internal address IADD, which is input right before a pulse of the row hammer command signal RH_CP is generated, is sampled as the target address TADD when the target address TADD for a row hammer refresh is generated. The signal correction circuit 213 may be implemented identically with the signal correction circuit 103, illustrated in FIG. 1, and may generate the correction random signal RP_CAL to adjust the internal address IADD so that the internal address IADD is sampled as the target address TADD less than or equal to a preset number of times between consecutive pulses of the row hammer command signal RH_CP during a designation interval and a detection interval. The row hammer refresh circuit 215 may be implemented identically with the row hammer refresh circuit 105, illustrated in FIG. 1, may sample the internal address IADD as the target address TADD in response to the correction random signal RP_CAL, and may execute the row hammer refresh on memory cells adjacent to a memory cell that is accessed by the target address TADD.

The semiconductor device 10, described above with reference to FIG. 1, and the semiconductor device 203, described above with reference to FIG. 11, may be applied to an electronic system including a memory system, a graphic system, a computing system, and a mobile system. For example, referring to FIG. 12, an electronic system 1000 according to an embodiment of the present disclosure may include a data storage unit 1001, a memory controller 1002, buffer memory 1003, and an input and output (I/O) interface 1004.

In response to a control signal from the memory controller 1002, the data storage unit 1001 may store data (not illustrated) that is applied by the memory controller 1002, read the stored data (not illustrated), and output the read data to the memory controller 1002. The data storage unit 1001 may include nonvolatile memory capable of continuously storing data without losing the data although power is blocked. The nonvolatile memory may be implemented as flash memory (e.g., NOR flash memory or NAND flash memory), phase change random access memory (PRAM), resistive random access memory (RRAM), spin transfer torque random access memory (STTRAM), or magnetic random access memory (MRAM).

Figure 12:
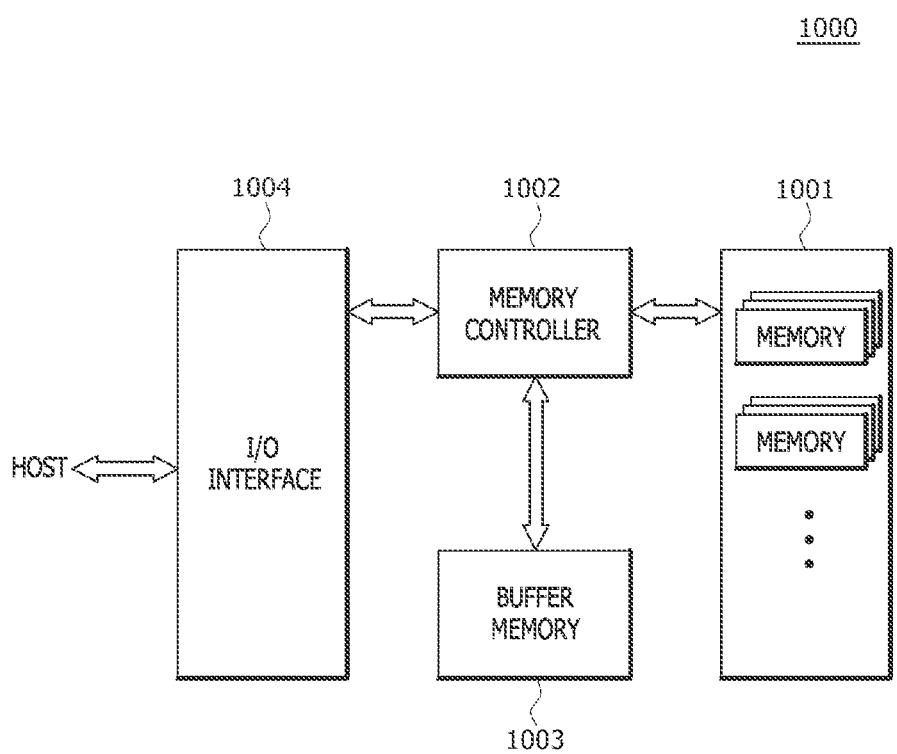
FIG. 12 is a block diagram illustrating a construction of an electronic system according to an example of the present disclosure.

The memory controller 1002 may decode an instruction that is applied by an external device (or a host device) through the I/O interface 1004 and may control the input and output of data to and from the data storage unit 1001 and the buffer memory 1003 based on the results of the decoding. In FIG. 12, the memory controller 1002 has been indicated as one block, but the memory controller 1002 may include a controller for controlling the data storage unit 1001 and a controller for controlling the buffer memory 1003, that is, volatile memory, which are independently constructed. The memory controller 1002 may include the controller 201 described with reference to FIG. 11.

The buffer memory 1003 may temporarily store data to be processed by the memory controller 1002, that is, data (not illustrated) that are input to and output from the data storage unit 1001. The buffer memory 1003 may store data (not illustrated) that is applied by the memory controller 1002 in response to a control signal from the memory controller 1002. The buffer memory 1003 may include the semiconductor device 10 described with reference to FIG. 1 and the semiconductor device 203 described with reference to FIG. 11. The buffer memory 1003 may read data that has been stored in the buffer memory 1003 and may output the read data to the memory controller 1002. The buffer memory 1003 may include volatile memory, such as dynamic random access memory (DRAM), mobile DRAM, and static random access memory (SRAM).

The I/O interface 1004 may provide a physical connection between the memory controller 1002 and an external device (or a host) so that the memory controller 1002 may receive a control signal for the input and output of data to and from the external device and may exchange data with the external device. The I/O interface 1004 may include one of various interface protocols, such as a USB, an MMC, PCI-E, an SAS, SATA, PATA, an SCSI, an ESDI, and IDE.

The electronic system 1000 may be used as an auxiliary memory device or external storage device of a host device. The electronic system 1000 may include a solid state disk (SSD), universal serial bus (USB) memory, a secure digital (SD) card, a mini secure digital (mSD) card, a micro SD card, a secure digital high capacity (SDHC) card, a memory stick card, a smart media (SM) card, a multi-media card (MMC), an embedded MMC (eMMC), and a compact flash (CF) card.

Figure 13:
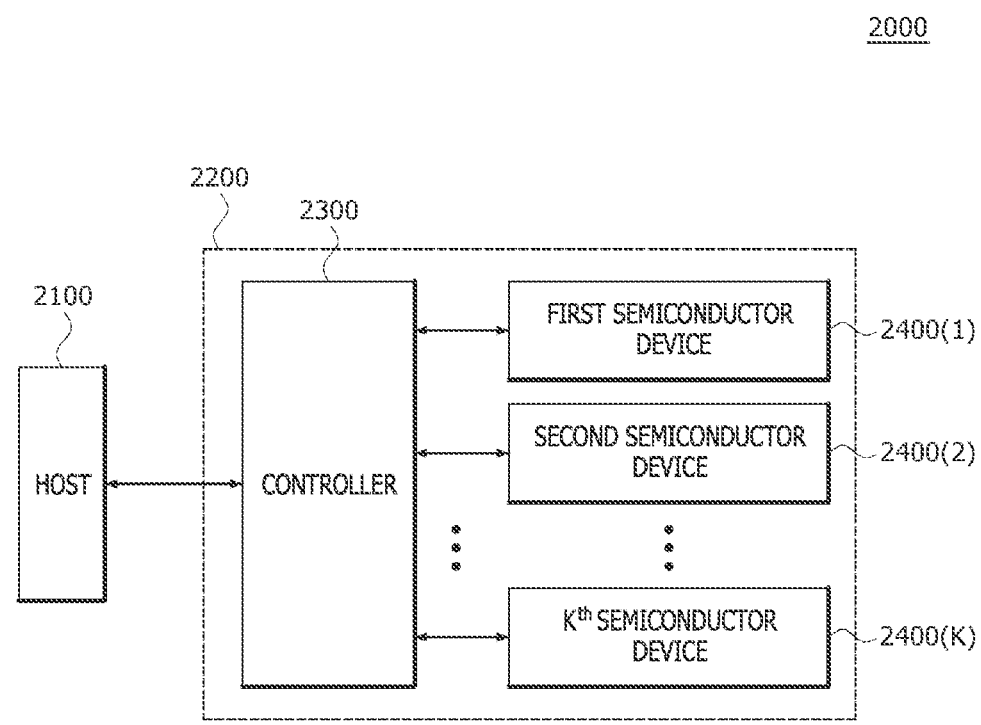
FIG. 13 is a block diagram illustrating a construction of an electronic system according to another embodiment of the present disclosure.

FIG. 13 is a block diagram illustrating a construction of an electronic system 2000 according to another embodiment of the present disclosure. As illustrated in FIG. 13, the electronic system 2000 may include a host 2100 and a semiconductor system 2200.

The host 2100 and the semiconductor system 2200 may mutually transmit signals by using an interface protocol. The interface protocol that is used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 2200 may include a controller 2300 and semiconductor devices 2400(1:K). The controller 2300 may apply a voltage code V_CD, a code input control signal CICNT, and a fuse selection address FS_ADD to each of the semiconductor devices 2400(1:K). Each of the semiconductor devices 2400(1:K) may set a detection interval by detecting that the internal address IADD, which is input right before a pulse of the row hammer command signal RH_CP is generated, is sampled as the target address TADD when the target address TADD for a row hammer refresh is generated and may adjust the number of times that the internal address IADD is sampled as the target address TADD between consecutive pulses of the row hammer command signal RH_CP during the detection interval.

The controller 2300 may include the controller 201 described with reference to FIG. 11. Each of the semiconductor devices 2400(1:K) may include the semiconductor device 10, described with reference to FIG. 1, and the semiconductor device 203 described with reference to FIG. 11. Each of the semiconductor devices 2400(1:K) may be implemented as one of dynamic random access memory (DRAM), phase change random access memory (PRAM), resistive random access memory (RRAM), magnetic random access memory (MRAM), and ferroelectric random access memory (FRAM).

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A semiconductor device comprising:
   an interval control circuit configured to generate a detection interval signal by detecting that an internal address, which is input right before a pulse of a row hammer command signal is generated, is sampled as a target address;
   a signal correction circuit configured to generate a correction random signal to adjust the internal address so that the internal address is sampled as the target address less than or equal to a preset number of times between consecutive pulses of the row hammer command signal during a designation interval and a detection interval in which the detection interval signal is activated; and
   a row hammer refresh circuit configured to execute a row hammer refresh based on the target address that is generated in response to the correction random signal.

2. The semiconductor device of claim 1, wherein the interval control circuit comprises a command signal generation circuit configured to generate a normal command signal and the row hammer command signal in response to a refresh signal that is generated for a refresh.

3. The semiconductor device of claim 2, wherein the command signal generation circuit is configured to generate a pulse of the row hammer command signal once after generating a pulse of the normal command signal (N−1) times when a pulse of the refresh signal is generated N times.

4. The semiconductor device of claim 2, wherein the interval control circuit further comprises a command random signal generation circuit configured to generate a pulse of a command random signal, when a random signal has been activated for a sampling operation, in synchronization with a timing at which the pulse of the row hammer command signal is generated.

5. The semiconductor device of claim 4, wherein the interval control circuit further comprises a detection interval signal generation circuit configured to generate the detection interval signal that is activated during an interval from a timing at which the pulse of the command random signal is generated to a timing at which a pulse of an interval reset signal is generated.

6. The semiconductor device of claim 4, wherein the interval control circuit further comprises a detection interval reset signal generation circuit configured to generate a pulse of an interval reset signal by counting a number of pulses of the row hammer command signal during the interval in which the detection interval signal is activated.

7. The semiconductor device of claim 6, wherein the detection interval reset signal generation circuit comprises:
   a command signal counter configured to generate a counting signal by counting the number of pulses of the row hammer command signal during the interval in which the detection interval signal is activated; and
   a count signal decoder configured to generate the interval reset signal by decoding the count signal.

8. The semiconductor device of claim 1, wherein the signal correction circuit comprises a synthesis interval signal generation circuit configured to generate a synthesis interval signal that is activated in the designation interval and the detection interval in response to a designation interval signal that is activated for each designation interval and the detection interval signal.

9. The semiconductor device of claim 8, wherein the signal correction circuit further comprises a correction random signal generation circuit configured to generate the correction random signal by adjusting an interval in which a random signal is activated between the consecutive pulses of the row hammer command signal during an interval in which the synthesis interval signal is activated.

10. The semiconductor device of claim 9, wherein the correction random signal generation circuit is configured to:
   during an interval in which the synthesis interval signal is activated, output the random signal as the correction random signal during an interval from a pulse of the row hammer command signal to a timing at which a preset edge of the random signal is generated a preset number of times, and during the interval in which the synthesis interval signal is activated, generate the correction random signal having a deactivated state after the preset edge of the random signal is generated the preset number of times until a subsequent pulse of row hammer command signal is generated.

11. The semiconductor device of claim 1, wherein the row hammer refresh circuit comprises a target address generation circuit configured to output the internal address as the target address by sampling the internal address when the correction random signal is activated.

12. The semiconductor device of claim 11, wherein the row hammer refresh circuit further comprises a row hammer control circuit configured to, when the target address is generated by sampling the internal address, control the execution of the row hammer refresh on memory cells adjacent to a memory cell that is accessed by the target address.

13. A semiconductor device comprising:
a command random signal generation circuit configured to generate a pulse of a command random signal, when a random signal is in a state in which the random signal has been activated for a sampling operation, in synchronization with a timing at which a pulse of a row hammer command signal is generated;
a correction random signal generation circuit configured to generate a correction random signal by adjusting an interval in which the random signal is activated between consecutive pulses of the row hammer command signal during a designation interval and a detection interval, in response to a detection interval signal that is activated during the detection interval from a timing at which the pulse of the command random signal is generated and a designation interval signal that is activated for each designation interval; and
a row hammer refresh circuit configured to execute a row hammer refresh based on a target address that is generated in response to the correction random signal.

14. The semiconductor device of claim 13, further comprising a command signal generation circuit configured to generate a normal command signal and the row hammer command signal in response to a refresh signal that is generated for a refresh.

15. The semiconductor device of claim 13, further comprising a detection interval signal generation circuit configured to generate the detection interval signal that is activated during an interval from the timing at which the pulse of the command random signal is generated to a timing at which a pulse of an interval reset signal is generated.

16. The semiconductor device of claim 13, further comprising a detection interval reset signal generation circuit configured to generate a pulse of an interval reset signal by counting a number of pulses of the row hammer command signal during the interval in which the detection interval signal is activated.

17. The semiconductor device of claim 16, wherein the detection interval reset signal generation circuit comprises:
a command signal counter configured to generate a counting signal by counting the number of pulses of the row hammer command signal during the interval in which the detection interval signal is activated; and
a count signal decoder configured to generate the interval reset signal by decoding the count signal.

18. The semiconductor device of claim 13, wherein the correction random signal generation circuit is configured to:
during an interval in which a synthesis interval signal is activated, output the random signal as the correction random signal during an interval from a pulse of the row hammer command signal to a timing at which a preset edge of the random signal is generated a preset number of times, and during the interval in which the synthesis interval signal is activated, generate the correction random signal having a deactivated state after the preset edge of the random signal is generated the preset number of times until a subsequent pulse of row hammer command signal is generated.

19. The semiconductor device of claim 13, wherein the row hammer refresh circuit comprises:
a target address generation circuit configured to output an internal address as the target address by sampling the internal address when the correction random signal is activated; and
a row hammer control circuit configured to control the execution of the row hammer refresh on memory cells adjacent to a memory cell that is accessed by the target address when the target address is generated by sampling the internal address.

20. A semiconductor system comprising:
a controller configured to apply a command and an address; and
a semiconductor device configured to set a detection interval by detecting that an internal address generated from the address, which is input right before a pulse of a row hammer command signal for a row hammer refresh is generated, is sampled as a target address based on the command, configured to adjust a number of times that the internal address is sampled as the target address between consecutive pulses of the row hammer command signal during the detection interval, and configured to execute the row hammer refresh based on the target address.

* * * * *